US00RE44300E

(19) United States
(12) Reissued Patent
Ronsisvalle

(10) Patent Number: US RE44,300 E
(45) Date of Reissued Patent: Jun. 18, 2013

(54) POWER DEVICE WITH HIGH SWITCHING SPEED AND MANUFACTURING METHOD THEREOF

(75) Inventor: Cesare Ronsisvalle, San Giovanni la Punta (IT)

(73) Assignee: STMicroelectronics S.r.l., Agrate Brianza (IT)

(21) Appl. No.: 13/549,308

(22) Filed: Jul. 13, 2012

Related U.S. Patent Documents

Reissue of:
(64) Patent No.: 7,755,139
Issued: Jul. 13, 2010
Appl. No.: 10/557,766
PCT Filed: May 19, 2003
PCT No.: PCT/IT03/00298
§ 371 (c)(1),
(2), (4) Date: Dec. 14, 2006
PCT Pub. No.: WO2004/102671
PCT Pub. Date: Nov. 25, 2004

(51) Int. Cl.
*H01L 31/113* (2006.01)
*H01L 31/119* (2006.01)

(52) U.S. Cl.
USPC ..... 257/341; 257/328

(58) Field of Classification Search
USPC ..... 257/328–377, E29.076, E29.214, 257/E29.125
See application file for complete search history.

(56) References Cited

U.S. PATENT DOCUMENTS

| | | | | |
|---|---|---|---|---|
| 4,717,940 | A | 1/1988 | Shinohe et al. | |
| 5,286,981 | A | 2/1994 | Lilja et al. | |
| 5,349,213 | A | 9/1994 | Bauer | |
| 5,413,313 | A | 5/1995 | Mutterlein et al. | |
| 6,441,408 | B2 | 8/2002 | Porst et al. | |
| 7,161,191 | B2 * | 1/2007 | Menard et al. | 257/355 |
| 7,982,528 | B2 | 7/2011 | Ronsisvalle et al. | |
| 2010/0001783 | A1 * | 1/2010 | Ronsisvalle et al. | 327/438 |

FOREIGN PATENT DOCUMENTS

| | | | |
|---|---|---|---|
| EP | 0520355 | B1 | 12/1995 |
| JP | 2002271672 | A | 11/1990 |
| JP | 2004369866 | | 12/1992 |
| JP | 2005036981 | | 2/1993 |
| JP | 2001177091 | A | 6/2001 |

* cited by examiner

*Primary Examiner* — Cuong Q Nguyen
(74) *Attorney, Agent, or Firm* — Seed IP Law Group PLLC

(57) ABSTRACT

A power device is formed by a thyristor and by a MOSFET transistor, series-connected between a first and a second current-conduction terminal. The power device moreover has a control terminal connected to an insulated-gate electrode of the MOSFET transistor and receiving a control voltage for turning on/off the device, and a third current-conduction terminal connected to the thyristor for fast extraction of charges during turning-off. Thereby, upon turning off, there are no current tails, and turning off is very fast. The power device does not have parasitic components and consequently has a very high reverse-bias safe-operating area.

31 Claims, 3 Drawing Sheets

POWER DEVICE WITH HIGH SWITCHING SPEED AND MANUFACTURING METHOD THEREOF

Matter enclosed in heavy brackets [ ] appears in the original patent but forms no part of this reissue specification; matter printed in italics indicates the additions made by reissue.

TECHNICAL FIELD

The present invention relates in general to the field of power devices, and more in particular to a power device usable as a power actuator.

BACKGROUND ART

As is known, power actuators must keep down to a minimum the dissipation of power both when on and during switching.

For this reason, for implementing a power actuator, there has been a passage from bipolar transistors (which have low on-dissipation) and from MOS transistors, (which have low dissipation during switching) to hybrid components that combine the advantages of both types.

In addition, power actuators must also have high input impedance and hence be driven with low-voltage pulses. Consequently, the various hybrid solutions that have been proposed (such as, insulated-gate bipolar transistors—IGBTs, MOS-controlled thyristors—MCTs, and emitter-switched thyristors—ESTs), in addition to presenting different levels of compromise between power dissipation when on and during switching, have been designed so as to be able to meet also this requisite and hence are driven by an insulated-gate electrode.

Amongst the hybrid solutions proposed, the most versatile solution is the IGBT one, even though its characteristics do not render it suitable for applications requiring a high blocking voltage (maximum reverse voltage that the device is able to withstand without going into breakdown), which is typically higher than 1200 V. In fact, at higher voltages, the power dissipation in the on state becomes important; on the other hand, in order to increase the blocking voltage, it is necessary to increase the size of the device, With consequent increase in the cost.

In order to overcome the above limitation, structures have been proposed based upon thyristors, which have a smaller forward voltage drop Vf during operation, and driven like MOSFETs, i.e., with a control voltage such as IGBTs, MCTs and ESTs belong to this category.

Both of the solutions have, however, a rather modest reverse-bias safe-operating area (RBSOA) and long turning-off times, so that their use has remained limited to very particular application fields.

DISCLOSURE OF INVENTION

The aim of the invention is thus to provide a power device having a low voltage drop both during switching and in the on state, and moreover having a low input impedance and a high switching speed.

According to the present invention, there are provided a power device, the operating method thereof, and the manufacturing method thereof, as defined in claims 1, 9 and 14, respectively.

The power device according to the invention combines a thyristor structure, and hence has a low voltage drop across its terminals in the on state, with a high input impedance, such as an IGBT. The described power device has very short switching times, comparable with those of a MOSFET, by virtue of a fast removal of charges from the base during turning-off, in a way similar to gate-turnoff (GTO) thyristor devices, so that the present power device may be defined as a MOS-GTO. In addition, the present power device does not have parasitic components, so that it affords both a high forward-bias safe-operating area (FBSOA) and a high reverse-bias safe-operating area (RBSOA).

BRIEF DESCRIPTION OF THE DRAWINGS

For an understanding of the present invention a preferred embodiment thereof is now described, purely by way of non-limiting example, with reference to the attached drawings, wherein.

BEST MODE FOR CARRYING OUT THE INVENTION

Figure 1:
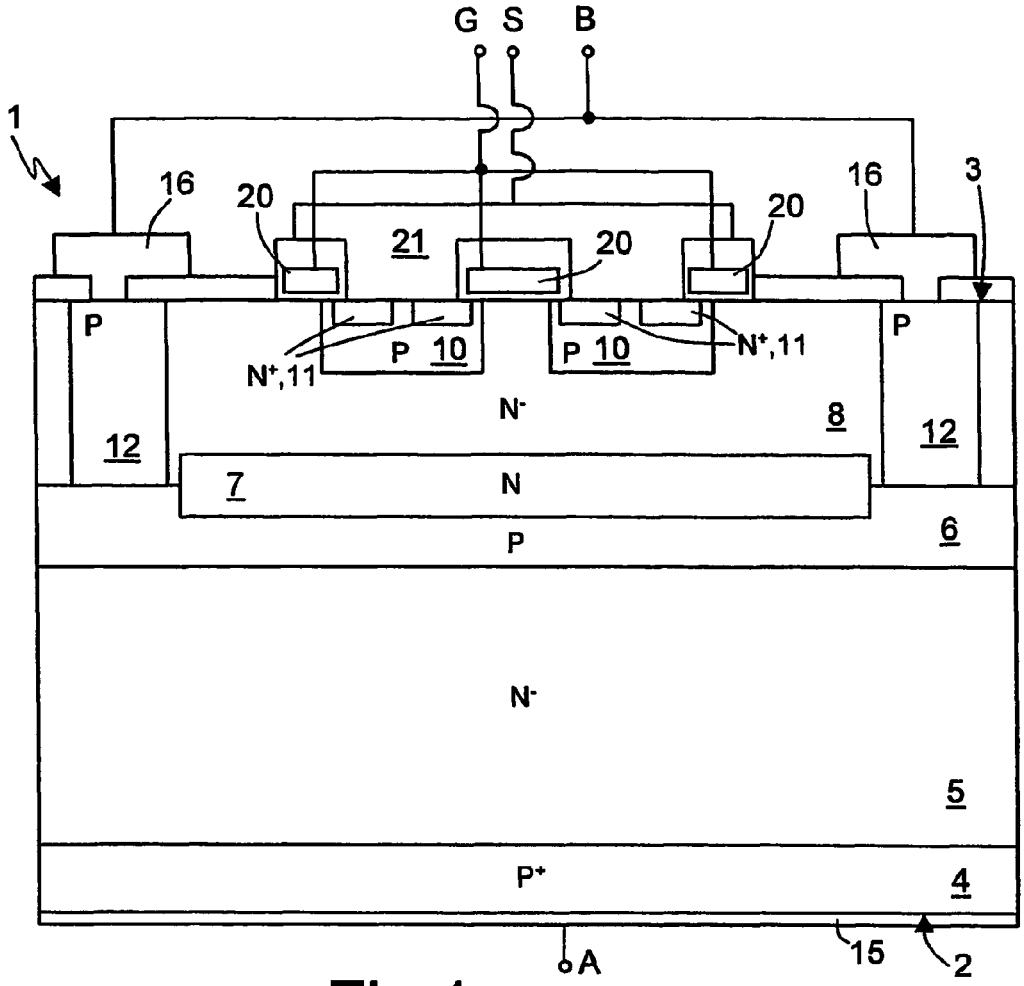
FIG. 1 illustrates a cross-section through a device according to the invention.

FIG. 1 is a cross-section of an elementary structure of a power device 1 according to one embodiment of the invention. The power device 1 may in any case comprise a plurality of elementary structures arranged alongside one another. Each elementary structure may moreover comprise one or more MOSFET cells. In the embodiment illustrated in FIG. 1, the elementary structure comprises two elementary cells.

According to FIG. 1. (not drawn to scale in the vertical direction), the power device 1 is formed by a body of semiconductor material, which has a bottom surface 2 and a top surface 3 and comprises: a substrate 4 of $P^+$-type; a first base region, also referred hereinafter as drift region 5, of $N^-$-type; a second base region, referred hereinafter as base region 6, of P-type; a cathode region 7, of N-type; and an epitaxial region 8, of $N^-$-type. The epitaxial region 8 moreover accommodates body regions 10, source regions 11, and a deep well 12.

The bottom surface 2 of the power device 1, formed by the substrate 4, is coated with a metal layer 15, connected to an anode terminal A accessible from outside the power device.

The drift region 5 is formed by a layer that is not accessible from outside and is grown epitaxially, as explained in greater detail hereinafter. The characteristics (thickness and resistivity) of the drift region 5 depend upon the voltage class of the power device 1. The thickness of the drift region 5 may be, for example, 70-80 μm and the resistivity 50-70 Ω.cm. It is moreover possible to provide a thin $N^+$ layer (not illustrated) between the drift region 5 and the substrate 4 so as to increase the breakdown voltage of the device, in a per se known manner.

The base region 6 is formed by a buried region, connected with the top surface 3 by the deep well 12, of P-type, which extends through the epitaxial region 8 between the top surface 3 and the base region 6 and connects the base region 6 to a base contact 16, which is in turn connected to a base terminal B accessible from outside.

The cathode region 7 is formed by a buried region not connected with the outside of the device and delimited laterally by the deep well 12, without necessarily being contiguous to the latter. Typically, the cathode region 7 has a resistivity of 0.02-1 Ω.cm.

The epitaxial region 8 preferably has the same resistivity as the drift region 5 (for example, 50-70 Ω.cm) but a much smaller thickness; typically, it has a thickness of 3-5 μm.

The body regions 10 are accommodated inside the epitaxial region 8 and are surrounded by the deep well 12. In the example illustrated, two body regions 10 are present, adjacent to one another; alternatively, just one body region 10 or more than two adjacent body regions may be provided.

The source regions 11 are accommodated inside the body regions 10, similarly to what is known in the technology of power MOSFET devices.

Gate regions 20, of polycrystalline silicon, extend on the top surface 3, are electrically insulated from the latter by a thin dielectric layer (gate oxide), and are connected to one another in a way not illustrated. In the illustrated example, three gate regions 20 are arranged adjacent to one another, on top of the portions of the body regions 10 comprised between the source regions 11 and the epitaxial region 8. The gate regions 20 are moreover partially arranged on top of an epitaxial region 8 and of the source regions 11, in a known manner. The gate regions 20 are moreover connected to a gate terminal G accessible from outside, in order to enable control (turning-on/turning-off) of the power device 1.

A source metal region 21 extends on top of the surface 3, between the portions of the gate region 20, contacts the source regions 11 and body regions 10, and is connected to a source terminal S accessible from outside.

Figure 2:
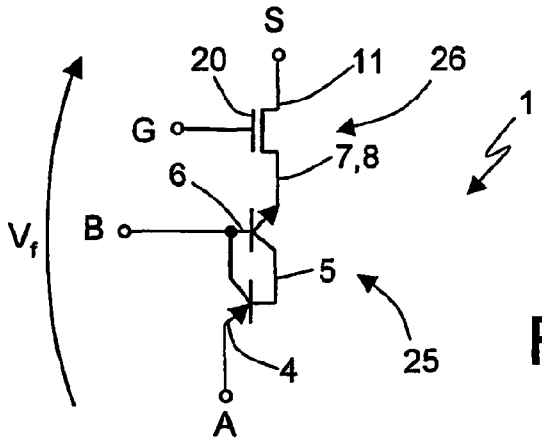
FIG. 2 illustrates the equivalent electrical circuit of the device of FIG. 1.
Figure 3:
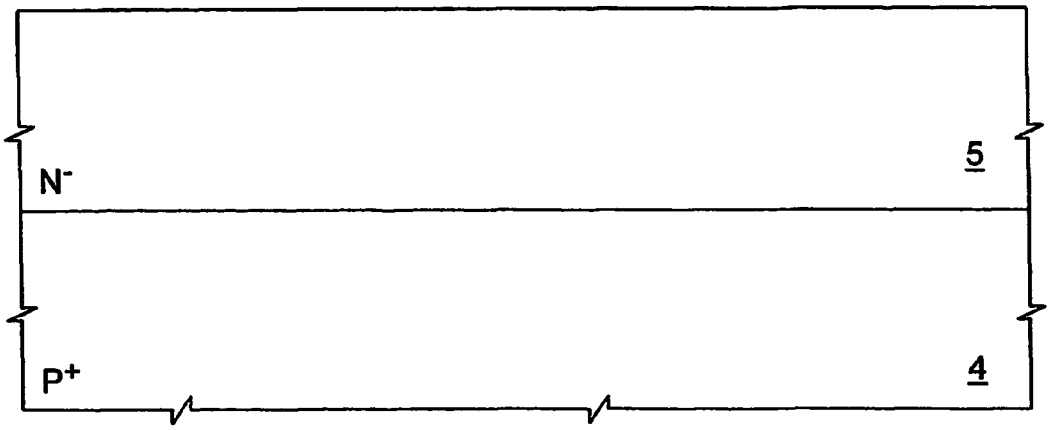
FIGS. 3 to 7 are cross-sections through a semiconductor material wafer, in successive manufacturing steps of the device of FIG. 1.

In practice, as illustrated in the equivalent electrical circuit of FIG. 2, the regions described above form a thyristor 25, which is connected in series to a vertical-flow MOS transistor 26. In detail, the thyristor 25 is formed by the substrate 4 (anode), by the drift region 5 (first base), by the base region 6 (second base), and by the cathode region 7 (cathode). The MOS transistor 26, which is of a low-voltage type, is formed by the same cathode region 7 (drain) and by the epitaxial region 8, the body region 10 (forming the channel), the source region 11, and the gate region 20.

Turning-on of the power device 1 is obtained first by turning on the MOS transistor 26 by supplying the gate terminal G with a gate voltage of a higher value than the threshold voltage, and then by turning on the thyristor 25. Turning-on of the thyristor 25 may take place in a traditional way, by supplying a current pulse to the base terminal B, or else by supplying a constant voltage of a few volts (for example, 2-4 V) to the base terminal B. In this case, the voltage to the base terminal B is maintained throughout operation of the power device 1. This second solution simplifies the circuit for driving the power device 1.

As in traditional thyristors, the turning-on current depends upon the common-base gain of the PNP and NPN transistors that form the thyristor 25.

Turning-on of the device thus causes a passage of current from the anode terminal A to the source terminal S.

In use, the MOS transistor 26 operates as a simple current switch, which has a negligible voltage drop, given the small thickness of the epitaxial region 8. Consequently, the voltage drop (Vf) between the anode terminal A and the source terminal S is due basically to the voltage drop across the thyristor 25 and is hence very low.

When the power device 1 is turned on, it can be turned off simply by removing the voltage applied to the gate terminal so as to turn off the inversion channel. In this way, extremely short switching times are obtained, of the order of a few tens of nanoseconds. This time is therefore much shorter than the turning-off time of a traditional thyristor (approximately 10 microseconds), and hence by three orders of magnitude, and shorter also than the IGBT turning-off time, which can vary between 100 ns and 3-4 μs.

When the MOS transistor 26 is turned off, all the anode current, that can no longer flow towards the source terminal S, is forced to be extracted from the base terminal B. The base current then reverses its direction: from incoming it becomes outgoing. In this way, all the charges stored in the base regions of the two PNP and NPN transistors which form the thyristor 25 (drift region 5 and base region 6) are forcedly removed, and hence also the anode current is rapidly reduced to zero.

The power device 1 illustrated in FIG. 1 is manufactured in the way described hereinafter with reference to FIGS. 3-7.

Initially (FIG. 3), the drift region 5 is grown epitaxially on top of a very-low-resistivity substrate 4 (for example, 5-10 m Ω.cm). The growth can take place in a single step, or through successive steps. As indicated above, the resistivity and the thickness of the drift region 5 depend upon the voltage class of the-device.

Figure 4:
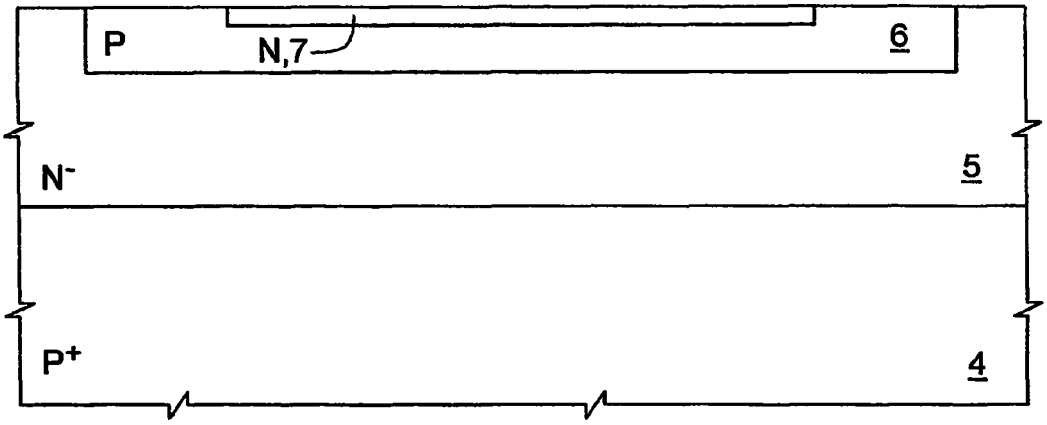

After the growth of a thermal oxide layer (not illustrated), boron is implanted using an appropriate phototechnique and, following upon diffusion, originates the base layer 6. Next, through a further phototechnique, implantation of an N-type dopant (for example, As, Sb or P, or a combination of these), and diffusion, the cathode layer 7 is obtained. In this way the structure of FIG. 4 is obtained. As may be noted, the cathode layer 7 has a smaller width than the base region 6 to allow formation of the deep wells 12.

Figure 5:
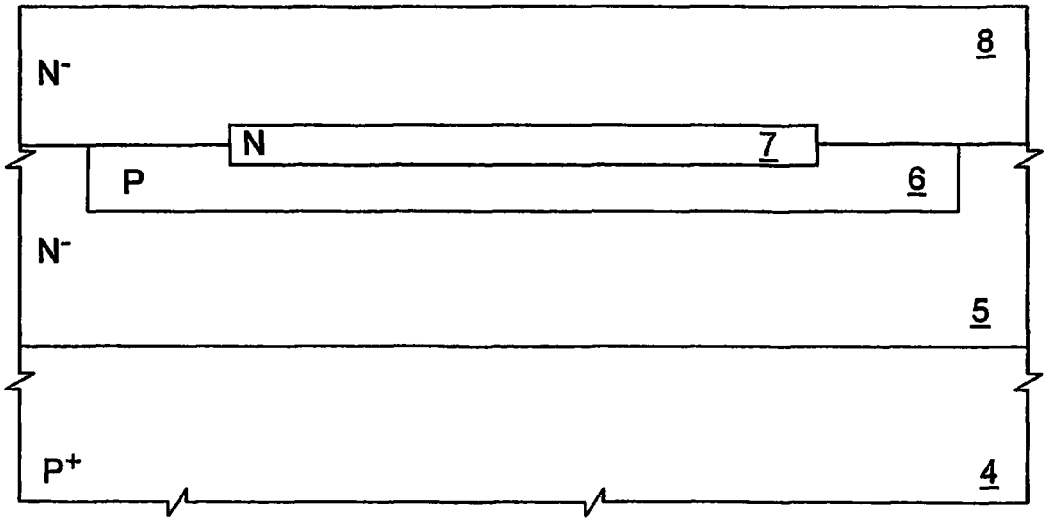
Figure 6:
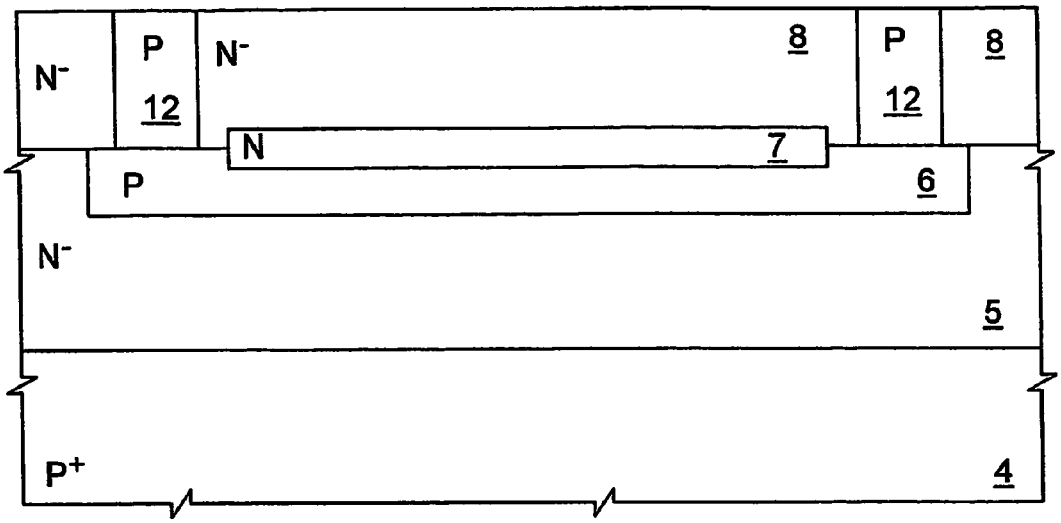
Figure 7:
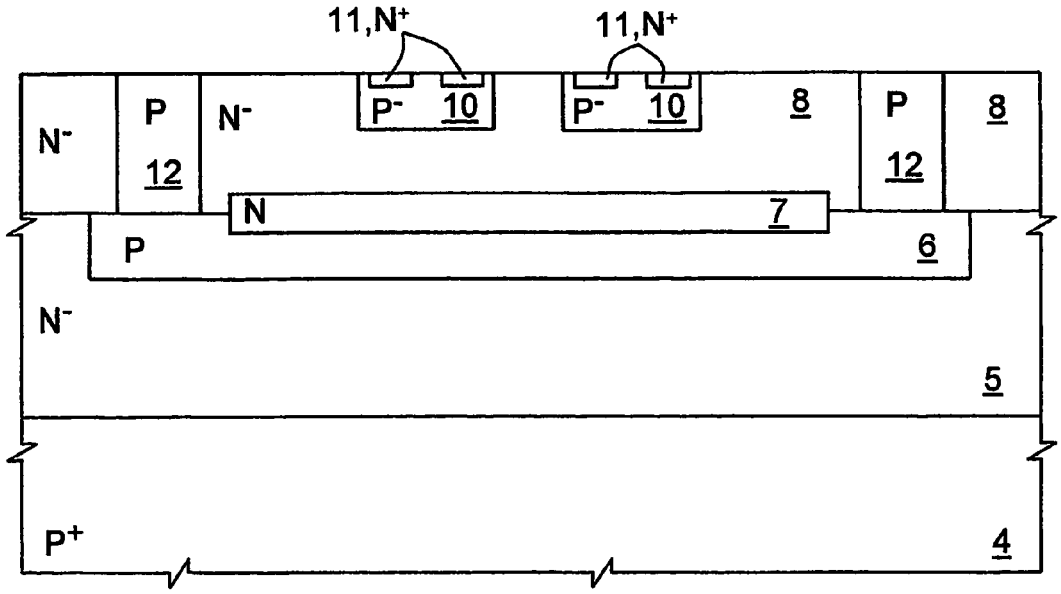

After removing the deposited thermal oxide layer, as well as the one grown during diffusion, a second epitaxial growth is performed for forming the epitaxial layer 8 (FIG. 5). As indicated, the epitaxial layer 8, of $N^-$-type, has a similar resistivity to the drift region 5, but a much smaller thickness.

Next (FIG. 6), the deep well 12 of P-type is implanted and diffused so as to reach the base region 6. As may be noted, the deep well 12 extends laterally with respect to the buried region 7; in the case of a device having more than one elementary structure, the deep well 12 is alternated with the buried region 7, so as to surround it on three sides.

Next, the MOS transistor 26 is formed, according to traditional techniques, by implanting first the body regions 10 and the source regions 11 (FIG. 7), and then forming the gate regions 20, and the source contact 21, the base contact 16, and the gate contact (not shown).

Finally, the wafer thus obtained is thinned on the back, until the desired thickness of the substrate 2 is obtained; then, the metal layer 15 is formed, and the wafer is diced, thereby obtaining the power device 1 of FIG. 1.

The advantages of the power device described herein are clear from the foregoing description. In particular, it is emphasized that, during turning-off, removal of the charges in the base of the thyristor by fast extraction, instead of by recombination, as in known devices, eliminates the current tails typical of bipolar devices, such as IGBTs and thyristors, thus guaranteeing extremely fast turning-off times.

In addition, the structure described and, in particular, the vertical implementation of the MOS, prevent formation of parasitic components which would limit its operation, so that the device has a very high reverse-bias safe-operating area.

The vertical implementation of the MOS transistor further enables a more compact embodiment, with a limited integration area.

Finally, it is clear that numerous modifications and variants can be made to the device and to the manufacturing process described and illustrated herein, all falling within the scope of the invention, as defined in the attached claims.

For example, the charge-extraction terminal could be connected to another region of the device, such as the drift region 5.

The invention claimed:

1. A power device, comprising:

a first current-conduction terminal;

a second current-conduction terminal;

a control terminal configured to receive a control voltage [for turning on/turning off said] *to turn the* device *on and off*;

*a field-effect transistor coupled to the second current-conduction terminal and having a gate electrode coupled to the control terminal;* a thyristor [and a field-effect transistor connected in series between] *coupled to* said first current-conduction terminal and [said second current-conduction terminal, said] *the* transistor [having a gate electrode connected to said control terminal]; and a third current-conduction terminal [connected] *coupled* to said thyristor and configured to extract charges from said thyristor [during turning-off] *as the device turns off.*

2. The device according to claim 1, wherein said transistor is of a vertical-current flow type.

3. The device according to claim 1, wherein the thyristor and transistor comprise a semiconductor body having:

a first surface and a second surface;

a substrate region defined by said first surface:

a first base region on top of said substrate region;

a second base region on top of said first base region;

a first conductive region on top of said second base region and defined by said second surface;

a second conductive region;

a channel region separating said first conductive region from the second conductive region; and a deep region extending from said second surface to one of said first and second base regions; said gate electrode of said transistor being arranged on top of and being electrically insulated from said second surface of said semiconductor body on top of said channel region; said first current-conduction terminal being [connected] *coupled* to said substrate region, said second current-conduction terminal being [connected] *coupled* to said second conductive region; and said third current-conduction terminal being [connected] *coupled* to said deep region.

4. The device according to claim 3, wherein said first conductive region is formed by a buried region arranged on top of said second base region, and by an epitaxial region arranged on top of said buried region, said buried region having a same conductivity type and different conductivity level with respect to said epitaxial region.

5. The device according to claim 4, wherein said buried region has a greater conductivity than said epitaxial region.

6. The device according to claim 4, wherein said buried region has a first width and said second base region has a second width greater than said first width, and said deep region extends laterally with respect to said buried region up to said second base region.

7. The device according to claim 3, wherein said first conductive region accommodates a body region [forming] *that forms* said channel region and [accommodating said] *the body region accommodates the* second conductive region; said deep region extending through said first conductive region.

8. The device according to claim 7, wherein said substrate region, said second base region and said body region are of P type, and said first base region, said first conductive region and said second conductive region are of N type.

9. A method, comprising: switching a power device that includes a thyristor and a field-effect transistor [connected] *coupled* together [in series] between a first conduction terminal and a second conduction terminal, said switching including:

turning on and turning off said power device through a control terminal of said transistor[;], *the turning off including:*

[wherein said step of turning off comprises] extracting electrical charges from said thyristor through a third current-conduction terminal [connected] *coupled* to said thyristor.

10. The method according to claim 9, wherein [said step of] turning on [comprises] *the power device includes* applying a control voltage to said control terminal and supplying an electrical quantity to said third current-conduction terminal.

11. The method according to claim 10, wherein said electrical quantity is a current pulse.

12. The method according to claim 10, wherein said electrical quantity is a d.c. voltage.

13. The method according to claim 12, wherein [said step of] turning off [comprises] *the power devices includes* interrupting application of said d.c. voltage.

14. A method of manufacturing a power device, comprising:

forming, in a body of semiconductor material, a thyristor and a field-effect transistor [connected in series] *coupled together*;

forming a first current-conduction terminal on a first surface of said body;

forming a second current-conduction terminal on a second surface of said body; [and]

forming a control terminal on top of said second surface of said body; and forming an electric-charge extracting terminal [connected] *coupled* to said thyristor.

15. The method according to claim 14, wherein forming the thyristor and transistor includes:

providing a substrate of a first conductivity type;

forming a first base region of a second conductivity type, on top of said substrate;

forming a second base region of said first conductivity type on top of said first base region;

forming a first conductive region of said second conductivity type on top of said second base region, said first conductive region forming a top surface of said body;

forming a deep region, of said first conductivity type, extending from said top surface as far as one of said first and second base regions;

forming at least one second conductive region adjacent to said first conductive region and separated therefrom through a channel region;

forming at least one insulated-gate region on top of said top surface and arranged on top of said channel region; and forming said first current-conduction terminal in contact with said substrate, said second current-conduction terminal in contact with said second conductive region, said charge-extraction terminal in contact with said deep region, and said control terminal in contact with said insulated-gate region.

16. The method according to claim 15, wherein [said step of] forming [a] *the* second conductive region [comprises] *includes* forming at least one body region inside said first conductive region and forming said second conductive region inside said body region.

17. The method according to claim 15, wherein [said step of] forming [a] *the* first conductive region [comprises]

*includes* forming a buried region on top of said second base region, and growing an epitaxial region on top of said buried region, said buried region and said epitaxial region having said second conductivity type and different conductivity levels.

18. The method according to claim 17, wherein said buried region has greater conductivity than said epitaxial region.

19. The method according to claim 17, wherein said buried region has a [lower] *smaller* width than said second base region, and [said step of] *the* forming [a] *of the* deep region [comprises] *includes* introducing dopant species through said epitaxial region up to said second base region, laterally with respect to said buried region.

20. The method according to claim 15, further comprising [the step of] thinning said substrate before forming said first current-conduction terminal.

21. A power device, comprising:

a first current-conduction terminal;

a second current-conduction terminal;

a control terminal;

a thyristor; and a vertical field-effect transistor [connected] *coupled* with the thyristor between the first current-conduction terminal and the second current-conduction terminal, the transistor having a gate electrode [connected] *coupled* to the control terminal*; and*

*a third current-conduction terminal coupled to the thyristor, the third current-conduction terminal being configured to extract charges from the thyristor.*

22. The device according to claim 21[, further comprising:] [a] *wherein the* third current-conduction terminal [connected to the thyristor and extracting] *is configured to extract the* charges from the thyristor [during turning-off of] *as* the device *is turned off.*

23. The device according to claim 21 wherein the transistor is structured to isolate the thyristor from the first current-conduction terminal when the transistor is off.

24. The device according to claim 21 wherein the transistor includes:

a first conduction region positioned in a semiconductor body and [connected] *coupled* to the first current-conduction terminal;

a channel region positioned in the semiconductor body and below the gate electrode; and a second conduction region positioned in the semiconductor body on an opposite side of the channel region from the first conduction region, wherein the thyristor includes:

a buried region underlying the second conduction region and isolated from the first current-conduction [region] *terminal* by the second conduction region;

a first base underlying the buried region;

a second base underlying the first base; and a substrate region underlying the second base and [connected] *coupled* to the second current-conduction [region] *terminal.*

25. The device according to claim 24, further comprising a deep region extending from a surface of the semiconductor body to a portion of the first base that extends laterally with respect to the buried region.

26. The device according to claim 25, wherein the deep region laterally surrounds the first and second conduction regions and the channel region.

27. The device according to claim 21 wherein the channel region includes a body region positioned completely within the second conduction region, the first conduction region being positioned completely within the body region.

*28. A power device, comprising:*

*a first current-conduction terminal;*

*a second current-conduction terminal;*

*a third current-conduction terminal;*

*a thyristor having:*

*a first terminal coupled to the first current-conduction terminal;*

*a second terminal coupled to the third current-conduction terminal, the second terminal configured to extract charges from the thyristor as the device powers off; and*

*a third terminal;*

*a field-effect transistor having:*

*a gate terminal configured to receive a control voltage to power on and power off the device;*

*a first conductive terminal coupled to the second current-conduction terminal; and*

*a second conductive terminal coupled to the third terminal of the thyristor.*

*29. The device according to claim 28 wherein:*

*the first conductive terminal of the transistor is in a semiconductor body;*

*a channel region of the transistor is in the semiconductor body below the gate electrode; and*

*the second conductive terminal of the transistor is in the semiconductor body on an opposite side of the channel region from the first conductive terminal;*

*a buried region of the thyristor is below the second conductive terminal and is isolated from the second current-conduction terminal by the second conductive terminal;*

*a first base of the thyristor is below the buried region;*

*a second base of the thyristor is below the first base; and*

*a substrate region is below the second base and coupled to the first current-conduction terminal.*

*30. A power device, comprising:*

*a thyristor having a base;*

*a field-effect transistor having a gate;*

*a first current-conduction terminal coupled to the thyristor;*

*a second current-conduction terminal coupled to the transistor;*

*a third current-conduction terminal coupled to the base of the thyristor and configured to extract charges from the thyristor as the device powers off; and*

*fourth current-conduction terminal coupled to the gate of the transistor.*

*31. The device according to claim 30 wherein:*

*the second current-conduction terminal of the transistor is coupled to a first conductive region in a semiconductor body;*

*a channel region of the transistor is in the semiconductor body below the gate electrode; and*

*a second conductive region of the transistor is in the semiconductor body on an opposite side of the channel region from the first conductive region;*

*a buried region of the thyristor is below the second conductive region and is isolated from the second current-conduction terminal by the second conductive region;*

*a first base of the thyristor is below the buried region;*

*a second base of the thyristor is below the first base; and*

*a substrate region is below the second base and coupled to the first current-conduction terminal.*

* * * * *